United States Patent [19]
Fang et al.

[11] Patent Number: 5,304,929
[45] Date of Patent: Apr. 19, 1994

[54] NUCLEAR MAGNETIC RESONANCE TOMOGRAPHY APPARATUS OPERABLE WITH A PULSE SEQUENCE ACCORDING TO THE ECHO PLANAR METHOD

[75] Inventors: Ming Fang, Plainsboro, N.J.; Ralf Ladebeck, Erlangen, Fed. Rep. of Germany; Franz Schmitt, Erlangen, Fed. Rep. of Germany; Michael Stehling, Erlangen, Fed. Rep. of Germany

[73] Assignee: Siemens Aktiengesellschaft, Munich, Fed. Rep. of Germany

[21] Appl. No.: 982,444

[22] Filed: Nov. 27, 1992

[30] Foreign Application Priority Data

Nov. 29, 1991 [DE] Fed. Rep. of Germany ....... 4139509

[51] Int. Cl.$^5$ ............................................ G01R 33/20
[52] U.S. Cl. ..................................... 324/309; 324/307
[58] Field of Search ............... 324/300, 307, 309, 310, 324/311, 312, 313, 314; 128/653.2

[56] References Cited

U.S. PATENT DOCUMENTS

| | | | |
|---|---|---|---|
| 4,940,941 | 7/1990 | Rzedzian | 324/312 |
| 5,057,776 | 10/1991 | Macovski | 324/309 |
| 5,068,609 | 11/1991 | Bruder et al. | 324/309 |
| 5,162,730 | 11/1992 | Schmitt et al. | 324/309 |
| 5,245,282 | 9/1993 | Mugler, III | 324/309 |

FOREIGN PATENT DOCUMENTS 0076054  4/1983  European Pat. Off. .

*Primary Examiner*—Michael J. Tokar
*Attorney, Agent, or Firm*—Hill, Steadman & Simpson

[57] ABSTRACT

In nuclear magnetic resonance tomography apparatus operable with a pulse sequence according to the echo-planar method, only a part of the k-space is scanned in the phase-coding direction per data acquisition, i.e., per radio-frequency excitation pulse. A phase-coding gradient is used such that regions of the k-space which are interleaved relative to each other are scanned in successive data acquisitions in the phase-coding direction. The number of echoes employed for the raw data matrix, and thus the resolution in phase-coding direction, or the length of the individual pulses of the read-out gradient, and thus the resolution in read-out direction, can thereby be enhanced.

5 Claims, 4 Drawing Sheets

NUCLEAR MAGNETIC RESONANCE TOMOGRAPHY APPARATUS OPERABLE WITH A PULSE SEQUENCE ACCORDING TO THE ECHO PLANAR METHOD

BACKGROUND OF THE INVENTION

1. Field of the Invention

The present invention is directed to a nuclear magnetic resonance tomography apparatus of the type operable using a pulse sequence according to the echo-planar imaging method.

2. Description of the Prior Art

In the known echo-planar imaging method, a read-out gradient is employed which consists of a number of sub-pulses of alternating polarity and at least one phase-coding gradient are simultaneously generated after a radio frequency excitation pulse per data acquisition. The arising signals are digitized and are entered into a row of a raw data matrix in the k-space for each sub-pulse of the read-out gradient. The rows are ordered according to the phase factors defined by the phase-coding gradient. A sequence of this type according to the echo-planar method is described in European Application 0.076 054. Although extremely short image registration times (30 through 100 ms) can be achieved with this known EPI method, the image resolution in the phase-coding direction is limited by the limited number of achievable echoes, and is limited in read-out direction by the area under the sub-pulses of the read-out gradient, which cannot be arbitrarily increased. In conventional EPI methods, a 128×128 raw data matrix is typically employed.

SUMMARY OF THE INVENTION

It is an object of the present invention to provide a nuclear magnetic resonance tomography apparatus operable with a pulse sequence according to the echo planar imaging method, wherein the image resolution is improved compared to known EPI methods.

The above object is achieved in a magnetic resonance imaging apparatus wherein only a part of the k-space is scanned in the phase-coding direction per data acquisition, with the phase-coding gradient being designed so that regions of the k-space which are interleaved relative to each other are scanned in the phase-coding direction during successive acquisitions. By increasing the total number of echoes employed for producing the raw data matrix, an improvement in the resolution can thus be achieved in the phase-coding direction, or an improvement of the resolution in read-out direction can be achieved by extending the duration of the sub-pulses of the read-out gradient. By combining both measures, an improvement in the resolution in both directions is possible. As a result of the interleaving of the data acquisition, a favorable arrangement of the signal amplitudes is obtained in the overall raw data matrix. The method disclosed herein can be used not only for improving the resolution of the image, but also, if the same resolution as is available in conventional methods is acceptable, can be used to shorten the measuring time for each individual data acquisition. Image artifacts such as, for example, susceptibility artifacts caused by long measuring times after an excitation, are thus avoided. The scanning of different, interleaved regions of the k-space is preferably achieved by activating different setting gradients in the phase-coding direction before the read-out phase from acquisition-to-acquisition.

In a nuclear magnetic resonance tomography apparatus wherein a pre-phasing pulse is inserted in the phase-coding direction and/or the read-out direction between each excitation pulse and the read-out phase, each setting gradient can be activated in a time span between the pre-phasing pulse and a first sub-pulse of the read-out gradient. This time span can be maintained constant for all acquisitions, so as to maintain the influence of external gradients (which create field inhomogeneities) constant.

In order to avoid ghost images, the signal amplitudes obtained in different data acquisitions are preferably scaled so that differences in signal amplitudes between the acquisitions are compensated.

Signal differences between the different acquisitions can also be avoided by selecting flip angles for the excitation pulses for different acquisitions such that the respectively generated transversal magnetization remains the same.

DESCRIPTION OF THE PREFERRED EMBODIMENTS

Figure 1:
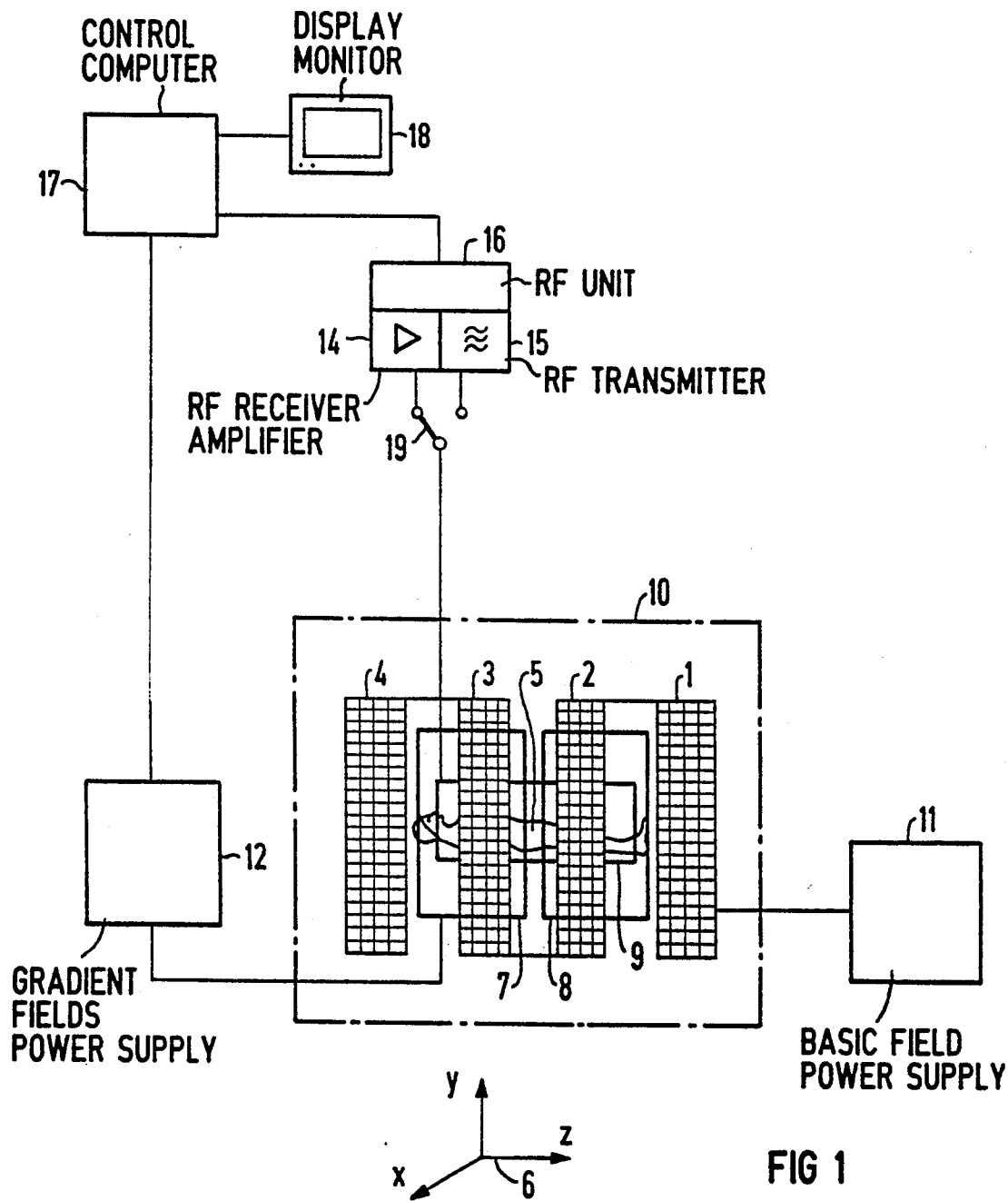
FIG. 1 is a schematic block diagram showing the basic components of a nuclear magnetic resonance tomography apparatus operable in accordance with the principles of the present invention.

The basic components of a nuclear magnetic resonance tomography apparatus operating in accordance with the principles of the present invention are schematically shown in FIG. 1. Coils 1 through 4 generate a basic magnetic field $B_0$, in which the body of a patient 5 to be examined is situated, given application of the apparatus for medical diagnostics. Gradient coils are also provided for generating independent magnetic field components respectively perpendicular to one another in the x, y and z directions, conforming to the Cartesian coordinate system 6. For clarity, only the gradient coils 7 and 8 are shown in FIG. 1 which, in combination with identical, oppositely-disposed gradient coils, generate the x-gradient. Coils (not shown) for generating the y-gradient are disposed parallel to, above and below, the patient 5, coils (not shown) for generating the z-gradient field are disposed transversely to the longitudinal axis of the patient 5, at the head and feet.

The apparatus also includes radio frequency antenna 9 which serves the purpose of generating and receiving nuclear magnetic resonance signals. The coils 1, 2, 3, 4, 7, 8 and 9 surrounded by the dot-dash line 10 represent the actual examination instrument. This instrument is operated by an electrical arrangement which includes a power supply 11 for operating the basic field coils 1 through 4 and a gradient fields power supply 12, to which the gradient coils 7 and 8 as well as the other gradient coils are connected. The radio frequency coil 9 is coupled to a process control computer 17 through radio frequency unit 16. Depending upon the status of a switch 19, the apparatus can be operated in a transmission mode, in which case the radio frequency coil 9 will be coupled to the computer 17 through a radio frequency transmitter 15, or in a reception mode, in which case the radio frequency coil 9 is coupled to the computer 17 through a signal amplifier 14. The computer 17 reconstructs an image of a slice of the patient 5 in a known manner from the data obtained during the reception mode, this image being visually displayed on a monitor 18 connected to the computer 17.

The principles of image generation according to the known echo-planar imaging method will be generally described with reference to FIGS. 2 through 7. A detailed description of this method can be found in the aforementioned, European Application 0 076 054.

Figure 2:
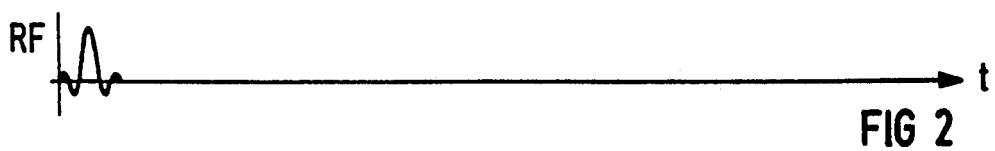
FIG. 2 shows an excitation pulse of the type generated in a conventional echo planar imaging method.
Figure 3:
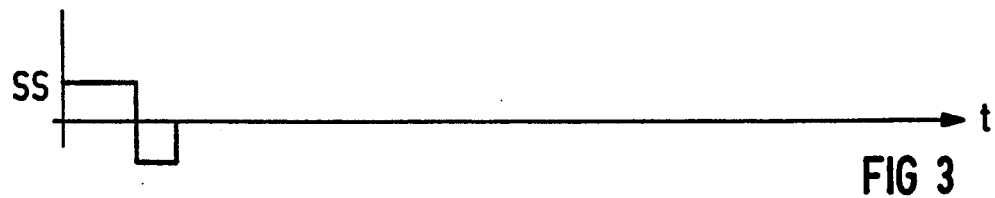
FIG. 3 shows a slice selection gradient of the type generated in a conventional echo planar imaging method.

At the beginning of the pulse sequence, a radio frequency excitation pulse RF is generated as shown in FIG. 2, to which the patient 5 is exposed simultaneously under the influence of a slice selection gradient SS (FIG. 3) in the z-direction. Nuclear spins in a slice of the patient 5 are thus excited. Subsequently, the direction of the gradient SS is inverted, so that the negative portion of the gradient SS cancels the de-phasing of the nuclear spins caused by the positive portion of the gradient SS.

Figure 4:
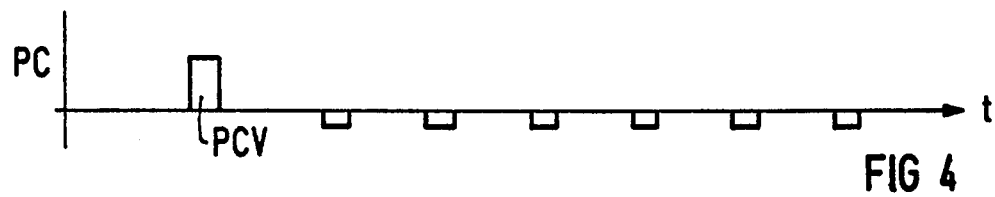
FIG. 4 shows a phase-coding gradient of the type generated in a conventional echo planar imaging method.
Figure 5:
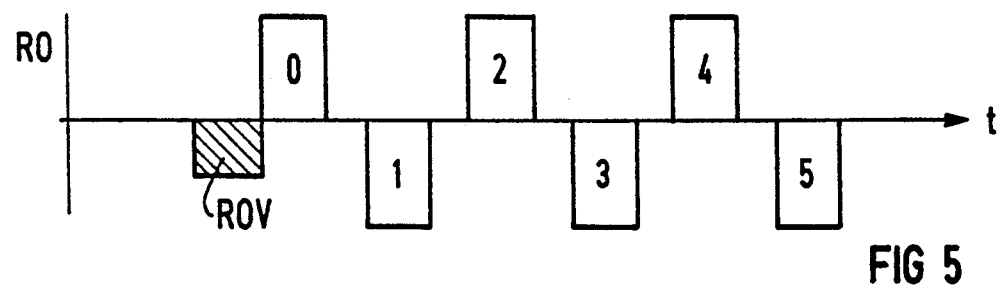
FIG. 5 shows a read-out gradient of the type generated in a conventional echo planar imaging method.

After such excitation, a phase-coding gradient PC as shown in FIG. 4 is generated in the y-direction and a read-out gradient RO as shown in FIG. 5 is generated in the x-direction. The read-out gradient RO is composed of a pre-phasing pulse ROV and a plurality of sub-pulses of alternating polarity numbered 0 through 5. The sub-pulses of the read-out gradient RO are shown in simplified form as being squarewave pulses, however, in practice, a sine function is usually employed because this is simpler to achieve in terms of apparatus technology.

Figure 6:
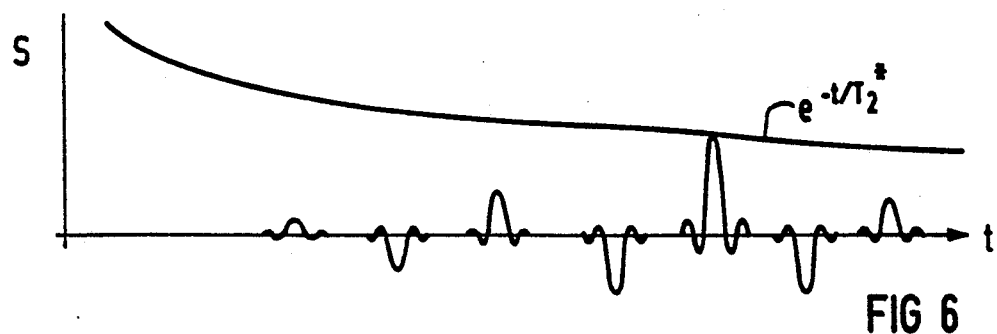
FIG. 6 shows a nuclear magnetic resonance signal of the type arising in a conventional echo planar imaging method.

As a result of the alternating polarity of the read-out gradient RO, the nuclear spins are de-phased, and in turn re-phased, in alternation, so that a sequence of signals S as shown in FIG. 6 arises. After a single excitation, enough signals are acquired so that the entire Fourier k-space is scanned, i.e., the existing data are adequate for reconstructing a complete tomogram of the selected slice.

The phase-coding gradient PC is briefly activated upon each change in the polarity of the read-out gradient RO. The phase relation of the nuclear spins is thereby advanced by one step each time. A pre-phasing gradient PCV is activated before the read-gradient, the purpose of which is described below.

Figure 7:
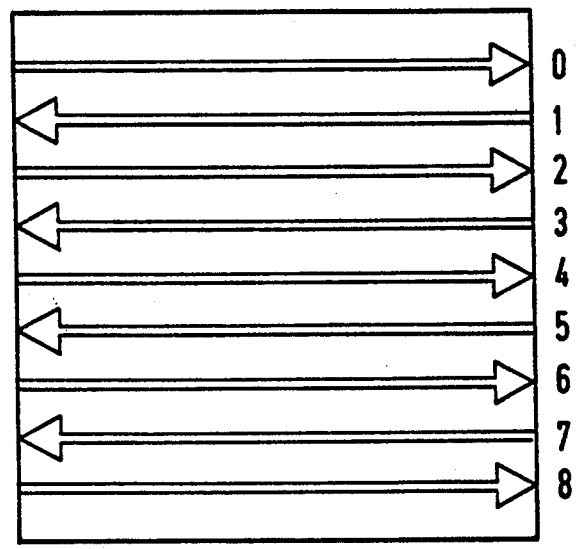
FIG. 7 shows a raw data matrix, with the manner of data entry being schematically indicated, obtained in a conventional echo planar imaging method.

The resulting nuclear magnetic resonance signals S are sampled in the time domain, are digitized, and the numerical values acquired in this manner are entered into a raw data matrix, as shown in FIG. 7. The raw data matrix can be considered to be a measured data space, such as a measured data plane in the two-dimensional case of the present exemplary embodiment. This measured space is generally known as k-space in nuclear magnetic resonance tomography.

The information regarding the spatial origin of the signal contributions S, necessary for the image generation, is coded in the phase factors. The relationship between a point $\zeta(x,y)$ in the locus space (i.e., the image) and the corresponding point $S(k_x, k_y)$ in the k-space is mathematically represented through a two-dimensional Fourier transformation, i.e, $$S(k_x,k_y) = \int\int \zeta(x,y)\exp[i(k_x x + k_y y)]dxdy.$$

The following definitions apply for the above Fourier transformation:

$$k_x(t) = \gamma \int_0^t G_x(t')dt' \text{ and}$$

$$k_y(t) = \gamma \int_0^t G_y(t')dt', \text{ wherein}$$

$\gamma$ = gyromagnetic ratio
$G_x(t')$ = momentary value of the read-out gradient RO
$G_y(t')$ = momentary value of the phase-coding gradient PC.

In the raw data matrix shown in FIG. 7, the row numbers correspond to the numbers of the sub-pulses of the read-out gradient shown in FIG. 5. For clarity, only 8 rows are shown in the raw data matrix of FIG. 7; in practice, the number of rows will be considerably larger, typically 128.

As a result of the step-by-step advancing of the phase-coding gradient PC, the scanning in the k-space ensues in successive rows, beginning with the row 0. The alternating polarity of the read-out gradient RO is taken into consideration by entering the measured values in opposite directions in successive rows, i.e., from left to right in row 0 and from right to left in row 1.

An image matrix, on the basis of which reconstruction then ensues, is acquired by two-dimensional Fourier transformation from the raw data matrix shown in FIG. 7, as noted above. The Fourier transformation supplies the best results when the measured values allocated to the signal maximum are disposed in the middle row (i.e., in row 4 in the exemplary embodiment). Otherwise, image artifacts can arise. This desired arrangement of the signal maximum within the matrix is achieved by pre-phasing the nuclear spins in the y-direction by the pulse PCV shown in FIG. 4. This pulse is timed so that a re-phasing is achieved precisely for the middle row (i.e., row 4 in the exemplary embodiment).

The image resolution achieved with a conventional EPI method of the type described above is limited for the following reasons.

The image resolution in the frequency coding direction (i.e., in the direction of the read-out gradient) is proportional to the area under the read-out gradient. Although increasing this area is theoretically possible by enlarging the gradient amplitudes, or by lengthening the duration of the gradient pulse, the possibilities for both types of increases are limited as a practical matter. An increase in the gradient amplitude necessarily results in a shortening of the gradient rise time and in an increase in the voltage at the gradient coils, as a consequence of the gradient coil inductance. The limits of the performance capability of the gradient amplifiers are thereby quickly reached. The physiological irritation phenomena which occur starting at defined thresholds of the magnetic field changes (dB/dt) constitute a further limiting factor.

Physical limits are also present with regard to lengthening of the gradient pulse duration. The available nuclear magnetic resonance signal S, as shown in FIG. 6, decays with a time constant $T_2^*$ ($T_2^*$ being the decay time constant of the nuclear magnetic resonance signal taking magnetic field inhomogeneities into consideration). The available read-out time is thus defined by $T_2^*$. If, therefore, the pulse duration of each sub-pulse of the read-out gradient is lengthened, the number of echoes, which correspond to the number of k-space rows, must be decreased for a given $T_2^*$. The image matrix thus comprises fewer rows in the phase-coding direction, so that the resolution is degraded in the phase-coding direction.

Lastly, the resolution in the phase-coding direction (i.e., in the direction of the phase-coding gradient) is limited by the number of echoes to be generated in the available read-out time.

Figure 12:
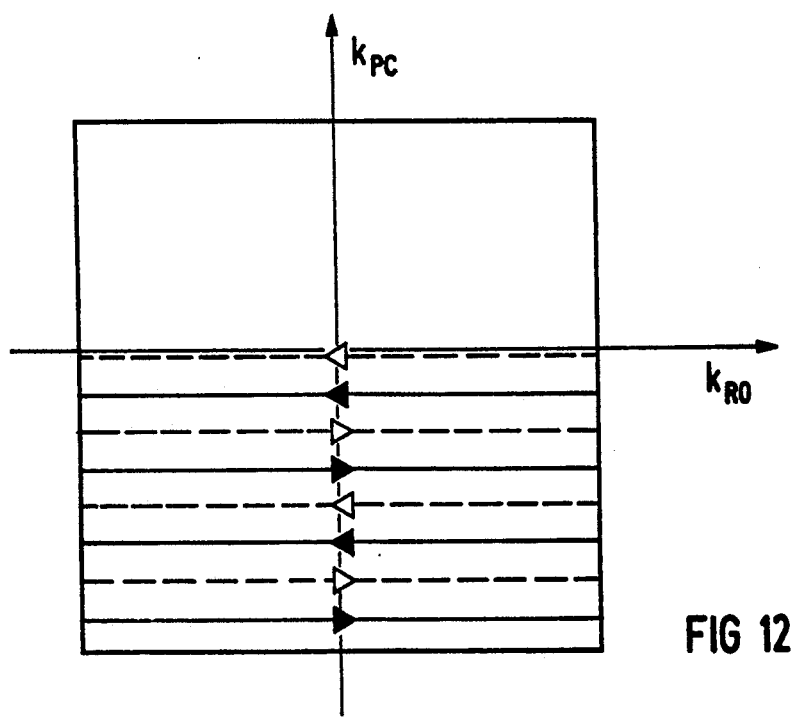
FIG. 12 is a schematic illustration of a raw data matrix obtained in accordance with the principles of the present invention, with data entry being schematically indicated.
Figure 8:
FIGS. 8 through 11 respectively show signals in a pulse sequence according to the present invention, corresponding to the conventional signals shown in FIGS. 2 through 7.
Figure 9:
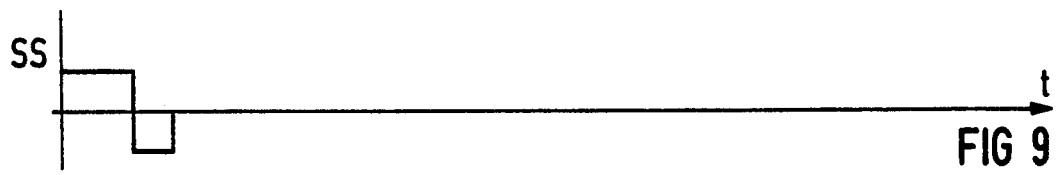

In the conventional EPI methods (128×128) image matrices are typically produced, given reception times between 30 and 100 ms. For example, a resolution of 1.5×1.5 mm$^2$ for head examinations, and 1.7×2.5 mm$^2$ in whole body examinations are thus achieved. The modification disclosed herein of the known EPI method is based on the concept of no longer scanning the entire k-space after an excitation, but instead scanning only a part thereof after an excitation. The modified method according to the invention is described below with reference to a pulse sequence shown in FIGS. 8 through 11, with the resulting raw data matrix being shown in FIG. 12. As in the previous example, the gradient pulses in these figures are shown only schematically, and not true-to-scale.

The pulse sequence of FIGS. 8 through 11 differs from the sequence in FIGS. 2 through 5 in that a setting gradient PCE is inserted in the phase-coding direction before the read-out phase for a fine adjustment of the phase relation. The area of this additional setting gradient PCE is varied for each excitation that leads to data acquisition of a partial k-space. As indicated by the dashed lines in FIG. 10, the area of the setting gradient PCE is preferably varied by varying the length thereof, since the length can be very precisely set with little technological outlay.

Figure 10:
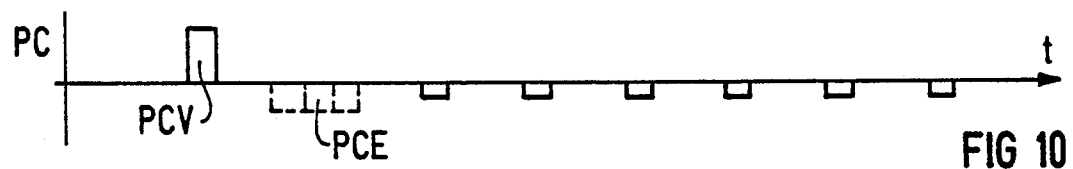

The phase-coding gradient according to FIG. 10 is dimensioned so that only every $n^{th}$ row of the raw data matrix ($k_{PC}$, $k_{RO}$) is respectively varied per acquisition (i.e., after an excitation). In the exemplary embodiment, this is every other row, as identified in the raw data matrix in FIG. 12 with solid lines. In a second acquisition, a phase shift is then implemented with the setting gradient PCF such that the k-space rows acquired in the second acquisition are between the k-space rows of the first acquisition, i.e., the respective rows of the two acquisitions are interleaved. The data in the k-space acquired in the second acquisition are shown with dashed lines in the raw data matrix of FIG. 12. For the general case of n acquisitions, a shift by one-fourth of the row spacing of the individual acquisition is undertaken between two acquisitions neighboring each other in the phase-coding direction.

It has been shown that a fine control or regulation of the phase-coding gradient (i.e., of the k-space position in the phase-coding direction) can be achieved with the necessary precision using the setting gradient PCE.

The k-space may alternatively consist of more than two acquisitions; in the general case, it consists of n acquisitions. It is important in each case that the k-space rows obtained in the individual acquisitions be interleaved within each other.

Figure 11:
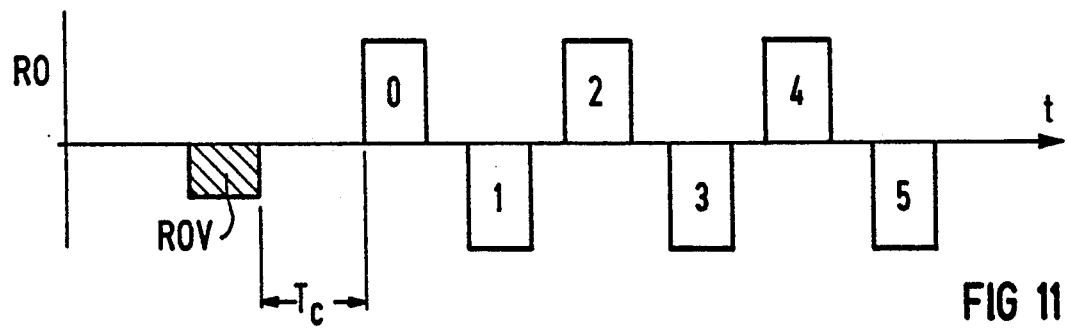

The time delay $T_c$ between the pre-phasing pulses PCV and ROV and a first individual pulse of the read-out gradient RO, as shown in FIGS. 10 and 11, is maintained constant in every case in order to keep the influence of external gradients (which created field inhomogeneities) constant.

In the inventive method, therefore, the number of sub-pulses of the read-out gradient RO and, thus, the number of the echoes in n acquisitions, can be reduced by the factor 1/n. Correspondingly, the individual pulses of the read-out gradient RO can be lengthened in duration by the factor n, given a read-out time limited by $T_2^*$. As described above, this, results in an enhancement of the resolution in the frequency-coding direction (i.e., in the direction of the read-out gradient RO).

If the length of the sub-pulses of the read-out gradient RO is not lengthened, the total number of available echoes is increased by the factor n, resulting in an enhancement of the resolution in the phase-coding direction. As a result of one of these two measures, or as a result of a combination of these two measures, therefore, an enhancement in the resolution in the frequency-coding direction and/or in the phase-coding direction can be achieved, at the expense of a lengthened measuring time, in adaption to individual examination requirements.

Signal differences which may arise in respectively different acquisitions would lead to MR ghosts following the Fourier transformation. When such ghosts arise, the k-space lines belonging to N different acquisitions can be scaled independently of one another after the acquisition of the raw data.

Given unaltered flip angles for different acquisitions, the generated transversal magnetization would vary from acquisition-to-acquisition, if one did not wait for the complete $T_1$ relaxation after each acquisition. This relaxation time, however, is in the range of between 3 and 5 seconds, and would therefore result in a lengthening of the procedure which would cancel the specific advantages of the EPI method. Unaltered transversal magnetization, however, can be achieved in the inventive method without waiting for the $T_1$ relaxation, by selecting the flip angle differently for each acquisition. In the case of two acquisitions, a first flip angle $\alpha=45°$ and a second flip angle $\alpha=90°$ are available. The signal amplitude $S_1=U_O \cos \alpha_1$ is then obtained for the first acquisition, and the signal amplitude $S_2=S_1 \cos \alpha_2$ is obtained for the second acquisition. Because the read-out times are extremely short (30 through 100 ms) in comparison to the $T_1$ relaxation time, the $T_1$ relaxation occurring during this time, which is of different degrees for different tissue, can be left out of consideration.

Although modifications and changes may be suggested by those skilled in the art, it is the intention of the inventors to embody within the patent warranted hereon all changes and modifications as reasonably and properly come within the scope of their contribution to the art.

We claim as our Invention:

1. A method for operating a nuclear magnetic resonance tomography apparatus with a pulse sequence according to a modified echo-planar imaging method, comprising the steps of:
   generating a radio frequency excitation pulse which causes nuclear magnetic resonance signals to arise in an examination subject;
   after each radio frequency pulse, generating a read-out gradient consisting of a plurality of sub-pulses having alternating polarity and generating a phase-coding gradient;
   acquiring said nuclear magnetic resonance signals in the presence of said read-out gradient and said phase-coding gradient and digitizing the acquired nuclear magnetic resonance signals;
   entering the acquired nuclear magnetic signals in respective rows of a raw data matrix in the k-space per pulse of said read-out gradient and ordering said rows according to phase factors defined by said phase-coding gradient; and
   scanning only a portion of said k-space in the phase-coding direction per signal acquisition by selecting said phase-coding gradient so that regions of said k-space interleaved relative to each other are scanned in the phase-coding direction in successive signal acquisitions.

2. A method as claimed in claim 1 comprising the additional step of:
   generating respectively different setting gradients in the phase-coding direction from signal acquisition-to-signal acquisition before generating said read-out gradient, for scanning different regions of said k-space.

3. A method as claimed in claim 2 comprising the additional step of inserting a pre-phasing pulse in the phase-coding direction between the excitation pulse and the read-out gradient wherein the step of inserting different setting gradients is further defined by inserting a setting gradient in a time span between said pre-phasing pulse and a first of said pulses of said read-out gradient, and maintaining said time span constant for all signal acquisitions.

4. A method as claimed in claim 1 comprising the additional step of:
   scaling signal amplitudes acquired in different signal acquisitions for compensating any signal amplitude differences between the said signal acquisitions.

5. A method as claimed in claim 1 comprising the additional step of:
   selecting respective flip angles for the excitation pulse for different signal acquisitions so that a transversal magnetization associated with said flip angle remains the same from signal acquisition-to-signal acquisition.

* * * * *